(12) United States Patent
Agarwal et al.

(10) Patent No.: US 9,548,744 B2
(45) Date of Patent: Jan. 17, 2017

(54) COMPENSATING FOR HYSTERETIC CHARACTERISTICS OF CRYSTAL OSCILLATORS

(71) Applicant: QUALCOMM Incorporated, San Diego, CA (US)

(72) Inventors: Vishal Agarwal, San Diego, CA (US); Mahadevan Srinivasan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/827,192

(22) Filed: Aug. 14, 2015

(65) Prior Publication Data

US 2016/0049945 A1    Feb. 18, 2016

Related U.S. Application Data

(60) Provisional application No. 62/038,718, filed on Aug. 18, 2014.

(51) Int. Cl.
*H03L 1/02*  (2006.01)
*H03B 5/04*  (2006.01)

(52) U.S. Cl.
CPC ............... *H03L 1/028* (2013.01); *H03B 5/04* (2013.01); *H03L 1/02* (2013.01)

(58) Field of Classification Search
CPC ............. H03L 1/02; H03L 1/028; H03B 5/04
USPC ........................................................ 331/176
See application file for complete search history.

(56) References Cited

U.S. PATENT DOCUMENTS

| 5,113,416 | A | 5/1992 | Lindell |
| 5,172,075 | A | 12/1992 | Yerbury et al. |
| 5,204,975 | A | 4/1993 | Shigemori |
| 5,420,593 | A | 5/1995 | Niles |
| 5,604,468 | A | 2/1997 | Gillig |
| 5,649,320 | A | 7/1997 | Korhonen et al. |

(Continued)

FOREIGN PATENT DOCUMENTS

| EP | 0483090 A1 | 4/1992 |
| GB | 2307812 | 6/1997 |

(Continued)

OTHER PUBLICATIONS

International Search Report and Written Opinion—PCT/US2015/045528—ISA/EPO—Oct. 30, 2015.

(Continued)

*Primary Examiner* — Jeffrey Shin
(74) *Attorney, Agent, or Firm* — Kilpatrick Townsend & Stockton LLP

(57) ABSTRACT

In some examples, compensating for hysteretic characteristics of a crystal oscillator in a timing circuit includes obtaining a plurality of successive temperature measurements. From the plurality of successive temperature measurements, a temperature gradient having a sign and a magnitude can be determined. A frequency compensation parameter can then be determined based on any combination of two or more factors chosen from a set of factors including a temperature measurement, the sign of the temperature gradient, and the magnitude of the temperature gradient. A frequency error of the timing circuit can then be compensated based on the frequency compensation parameter.

27 Claims, 7 Drawing Sheets

(56) References Cited

U.S. PATENT DOCUMENTS

| | | |
|---|---|---|
| 5,663,735 A | 9/1997 | Eshenbach |
| 5,717,403 A | 2/1998 | Nelson et al. |
| 5,731,742 A | 3/1998 | Wojewoda et al. |
| 5,740,525 A | 4/1998 | Spears |
| 5,742,908 A | 4/1998 | Dent |
| 5,774,800 A | 6/1998 | Mori |
| 5,777,524 A | 7/1998 | Wojewoda et al. |
| 5,841,396 A | 11/1998 | Krasner |
| 5,848,355 A | 12/1998 | Rasor |
| 5,854,605 A | 12/1998 | Gildea |
| 5,856,766 A | 1/1999 | Gillig et al. |
| 5,875,388 A | 2/1999 | Daughtry, Jr. et al. |
| 5,892,408 A | 4/1999 | Binder |
| 5,986,515 A | 11/1999 | Sakurai |
| 5,999,063 A | 12/1999 | Sakurai et al. |
| 6,040,744 A | 3/2000 | Sakurai et al. |
| 6,097,974 A | 8/2000 | Camp, Jr. et al. |
| 6,122,506 A | 9/2000 | Lau et al. |
| 6,161,003 A | 12/2000 | Lo Curto et al. |
| 6,222,483 B1 | 4/2001 | Twitchell et al. |
| 6,233,292 B1 | 5/2001 | Van Bezooijen et al. |
| 6,243,570 B1 | 6/2001 | Kobayashi |
| 6,424,826 B1 | 7/2002 | Horton et al. |
| 6,472,943 B1 | 10/2002 | Soong et al. |
| 6,522,871 B1 | 2/2003 | Patrick et al. |
| 6,559,731 B2 | 5/2003 | Jakobsson |
| 6,928,275 B1 | 8/2005 | Patrick et al. |
| 8,031,024 B1 | 10/2011 | Zaslavsky |
| 2002/0005765 A1* | 1/2002 | Ashley .................. H03L 1/026 331/176 |
| 2011/0121909 A1 | 5/2011 | Isohata et al. |

FOREIGN PATENT DOCUMENTS

| | | |
|---|---|---|
| JP | 61155880 A | 7/1986 |
| JP | 4097618 A | 3/1992 |
| JP | 06242208 | 9/1994 |
| JP | 6291872 A | 10/1994 |
| JP | 7254816 A | 10/1995 |
| JP | 9189754 A | 7/1997 |
| JP | 10065447 A | 3/1998 |
| WO | 9714049 | 4/1997 |
| WO | 9825157 | 6/1998 |
| WO | 9913595 A1 | 3/1999 |

OTHER PUBLICATIONS

Zhou, H., et al., "Frequency Accuracy & Stability Dependencies of Crystal Oscillators," Carleton University, Systems and Computer Engineering, Technical Report SCE-08-12, Nov. 2008, 15 pages.

\* cited by examiner

COMPENSATING FOR HYSTERETIC CHARACTERISTICS OF CRYSTAL OSCILLATORS

CROSS-REFERENCE TO RELATED APPLICATIONS

This application claims the benefit of U.S. Provisional Application No. 62/038,718, filed Aug. 18, 2014, entitled "Compensating for Hysteretic Characteristics of Crystal Oscillators" which is incorporated herein by reference in its entirety.

BACKGROUND

Crystal oscillators can be used in electronic devices to provide a frequency reference or to provide a clock signal for an electronic circuit. A crystal oscillator is designed to vibrate at a known frequency upon application of an appropriate input, such as a voltage. An ideal crystal oscillator vibrates at a known, unchanging frequency. However, in practice, a crystal oscillator will typically oscillate at different frequencies depending on the temperature of the crystal oscillator.

BRIEF SUMMARY

Certain embodiments are described for compensating for hysteretic characteristics of crystal oscillators. Different examples are described below. One example of a method for compensating for hysteretic characteristics of crystal oscillators, includes obtaining a plurality of successive temperature measurements; determining a temperature gradient having a sign and a magnitude, the temperature gradient based on at least two temperature measurements of the plurality of successive temperature measurements and a time between the at least two temperature measurements; determining a frequency compensation parameter based on any combination of two or more factors chosen from a set of factors including a temperature measurement, the sign of the temperature gradient, and the magnitude of the temperature gradient; and compensating for a frequency error of the timing circuit based on the frequency compensation parameter.

An example apparatus for compensating for hysteretic characteristics of crystal oscillators includes a sensor configured to sense a temperature, and a processor configured to obtain a plurality of successive temperature measurements from the sensor; determine a temperature gradient having a sign and a magnitude, the temperature gradient based on at least two temperature measurements of the plurality of successive temperature measurements and a time between the at least two temperature measurements; determine a frequency compensation parameter based on any combination of two or more factors chosen from a set of factors including a temperature measurement, the sign of the temperature gradient, and the magnitude of the temperature gradient; and compensate for a frequency error of the timing circuit based on the frequency compensation parameter.

A further example system for compensating for hysteretic characteristics of crystal oscillators includes means for obtaining a plurality of successive temperature measurements; means for determining a temperature gradient having a sign and a magnitude, the temperature gradient based on at least two temperature measurements the plurality of successive temperature measurements and a time between the at least two temperature measurements; means for determining a frequency compensation parameter based on any combination of two or more factors chosen from a set of factors including a temperature measurement, the sign of the temperature gradient, and the magnitude of the temperature gradient; and means for compensating for a frequency error of the timing circuit based on the frequency compensation parameter.

One example non-transitory computer-readable medium comprises program code for a processor to execute a method for compensating for hysteretic characteristics of a crystal oscillator in a timing circuit, the program code including program code for obtaining a plurality of successive temperature measurements; program code for determining a temperature gradient having a sign and a magnitude, the temperature gradient based on at least two temperature measurements of the plurality of successive temperature measurements and a time between the at least two temperature measurements; program code for determining a frequency compensation parameter based on any combination of two or more factors chosen from a set of factors including a temperature measurement, the sign of the temperature gradient, and the magnitude of the temperature gradient; and program code for compensating for a frequency error of the timing circuit based on the frequency compensation parameter.

Still further examples are provided in the detailed description below, including examples for encoding program code on non-transitory computer-readable media for performing example methods described above and in the detailed description below.

BRIEF DESCRIPTION OF THE DRAWINGS

Aspects of the disclosure are illustrated by way of example. In the accompanying figures, like reference numbers indicate similar elements, and together with the description of example embodiments, serve to explain the principles and implementations of the embodiments.

DETAILED DESCRIPTION

Figure 1:
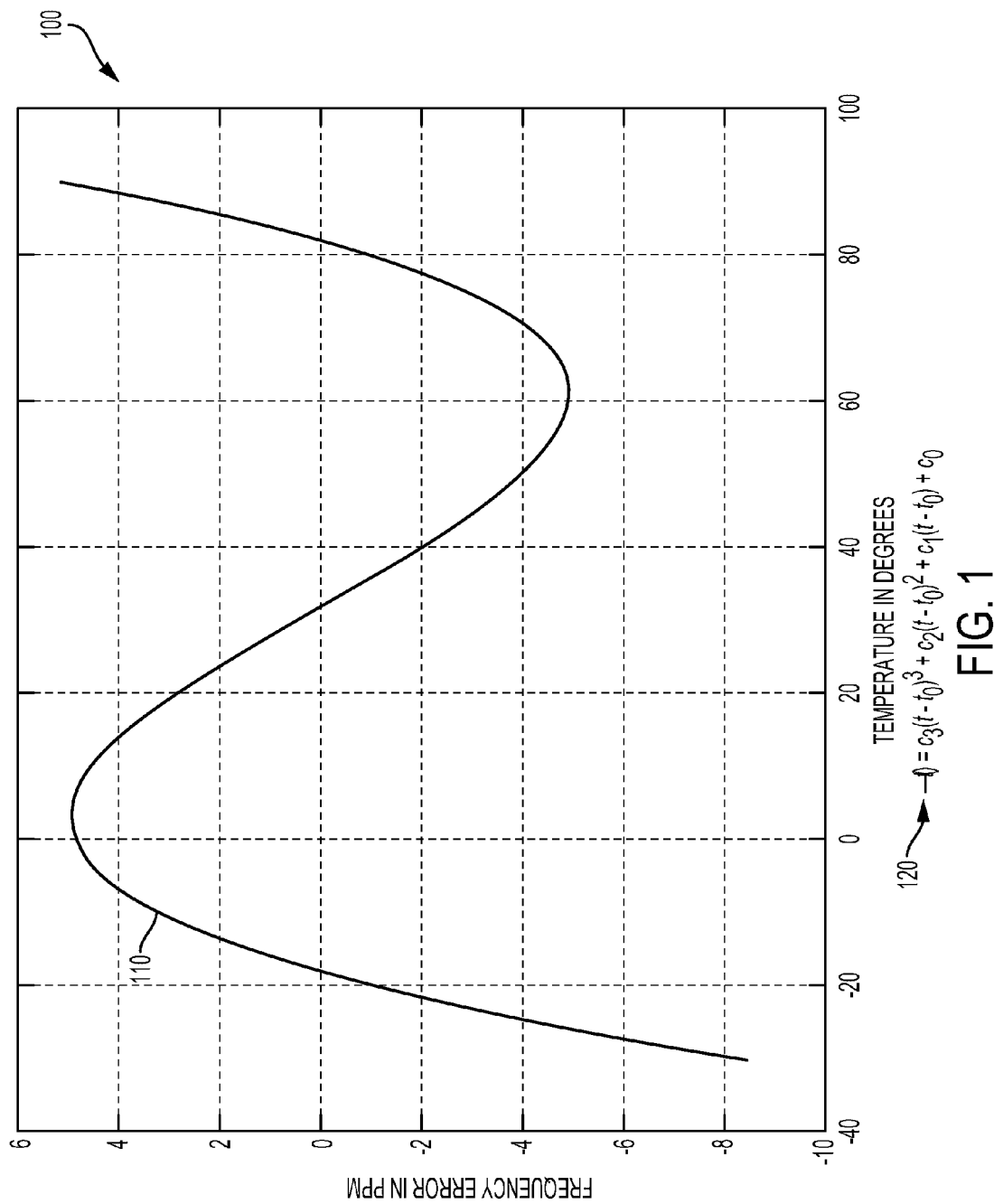
FIG. 1 shows a plot of frequency error as a function of temperature in a signal output by a timing circuit having a crystal oscillator without hysteretic effects.

Examples are described herein in the context of compensating for hysteretic effects in crystal oscillators. Those of ordinary skill in the art will realize that the following description is illustrative only and is not intended to be in any way limiting. Other embodiments will readily suggest themselves to such skilled persons having the benefit of this disclosure. Reference will now be made in detail to implementations of example embodiments as illustrated in the accompanying drawings. The same reference indicators will be used throughout the drawings and the following description to refer to the same or like items.

In the interest of clarity, not all of the routine features of the examples described herein are shown and described. It will, of course, be appreciated that variations of the teachings described within this specification may be implemented without deviating from the scope of this disclosure.

Some devices employ timing circuits with crystal oscillators as a frequency reference or as a clock source. For example, a smartphone may employ such a timing circuit for use with a global positioning system (GPS) receiver to enable accurate position services for the smartphone. However, the temperature of the crystal oscillator may vary over time due in part to the operation of the smartphone. For example, if the smartphone is used to make a cellular voice call, the cellular radio components can generate amounts of heat, which cause other components in the smartphone to heat up, including the crystal oscillator. As the crystal oscillator's temperature changes, its actual vibration frequency will vary and the output signal of the timing circuit will change. Furthermore, the relationship between frequency and temperature of crystal oscillators tends to exhibit hysteretic characteristics. For example, at a particular temperature, a crystal oscillator may vibrate at different frequencies depending on whether the temperature of the crystal oscillator is increasing or decreasing. However, software or hardware employing the timing circuit's output signal may be "unaware" of these changes and may continue to operate as though the output signal is invariant.

Further, the frequency of the output signal does not vary by a constant amount for any particular temperature. Rather, the frequency of the output signal may vary by two different amounts based on whether the temperature is increasing or decreasing. Further, the rate at which the temperature changes over time affects the amount by which the frequency of the output signal will vary from the vibration frequency at a particular steady-state temperature. In addition to the magnitude of the gradient, the magnitude of the frequency variance is also affected by the absolute temperature itself. Thus, compensating for frequency error in crystal oscillators can depend on many factors.

Thus, an example apparatus may be fitted with one or more temperature sensors to measure the temperature of components of the apparatus, such as the crystal oscillator itself, the timing circuit having the crystal oscillator, or components near the crystal oscillator or timing circuit. The apparatus is programmed or configured to receive successive temperature measurements over time from the temperature sensor(s), determine temperature gradients based on the successive temperature measurements, determine the sign and magnitude of the temperature gradients, and use one or more of these data points to determine a frequency compensation parameter for the output signal provided by the timing circuit or crystal oscillator. The apparatus can then apply the frequency compensation parameter in a wide variety of ways, described in more detail below, when performing certain tasks that rely on the frequency of the crystal oscillator's or timing circuit's output signal.

For example, the example apparatus could be part of a global positioning system (GPS) subsystem to enable the apparatus to determine its position. However, GPS signals received from GPS satellites are decoded, in part, based on a known frequency reference provided by a timing circuit including a crystal oscillator. Thus, when decoding GPS signals, the apparatus may employ the frequency compensation parameter to adjust the frequency of the output signal provided to the GPS subsystem to enable a more accurate calculated position. Such an example apparatus may be incorporated into a smartphone, a GPS receiver, a navigation system, or any other suitable device or system.

Referring now to FIG. 1, FIG. 1 shows a plot of frequency error as a function of temperature in a signal output by a timing circuit having a crystal oscillator without considering or calculating hysteretic effects. As can be seen in FIG. 1, the frequency error, in parts per million (ppm), is shown as the two-dimensional curve 110 as a function of the temperature in degrees Celsius. In other words, the curve 110 is an ideal frequency error vs. temperature curve. Thus, the curve 110 illustrates the frequency error of a crystal oscillator at any of a number of steady-state temperatures. For example, at approximately 32 degrees Celsius, this crystal oscillator has no frequency error. The function, $f(t)$, 120 used to generate the curve 110 is shown. The values of $c_0$, $c_1$, $c_2$, $c_3$, and $t_0$ are dependent on the crystal oscillator itself, while the value of t is the temperature of the crystal oscillator. The curve 110 can be used to determine a first-order calculation of a vibration frequency of a crystal oscillator by applying the frequency error calculated using curve 110 to a nominal frequency of the timing circuit having a crystal oscillator. In some examples, a means for determining an ideal frequency error of the crystal oscillator based at least on the temperature measurement may calculate the ideal frequency error of the crystal oscillator by solving the function, $f(t)$, described above based on a particular temperature value, t. As shown in greater detail below, a variance from this first-order calculation of the vibration frequency can be determined using temperature and/or temperature gradient information.

Figure 2:
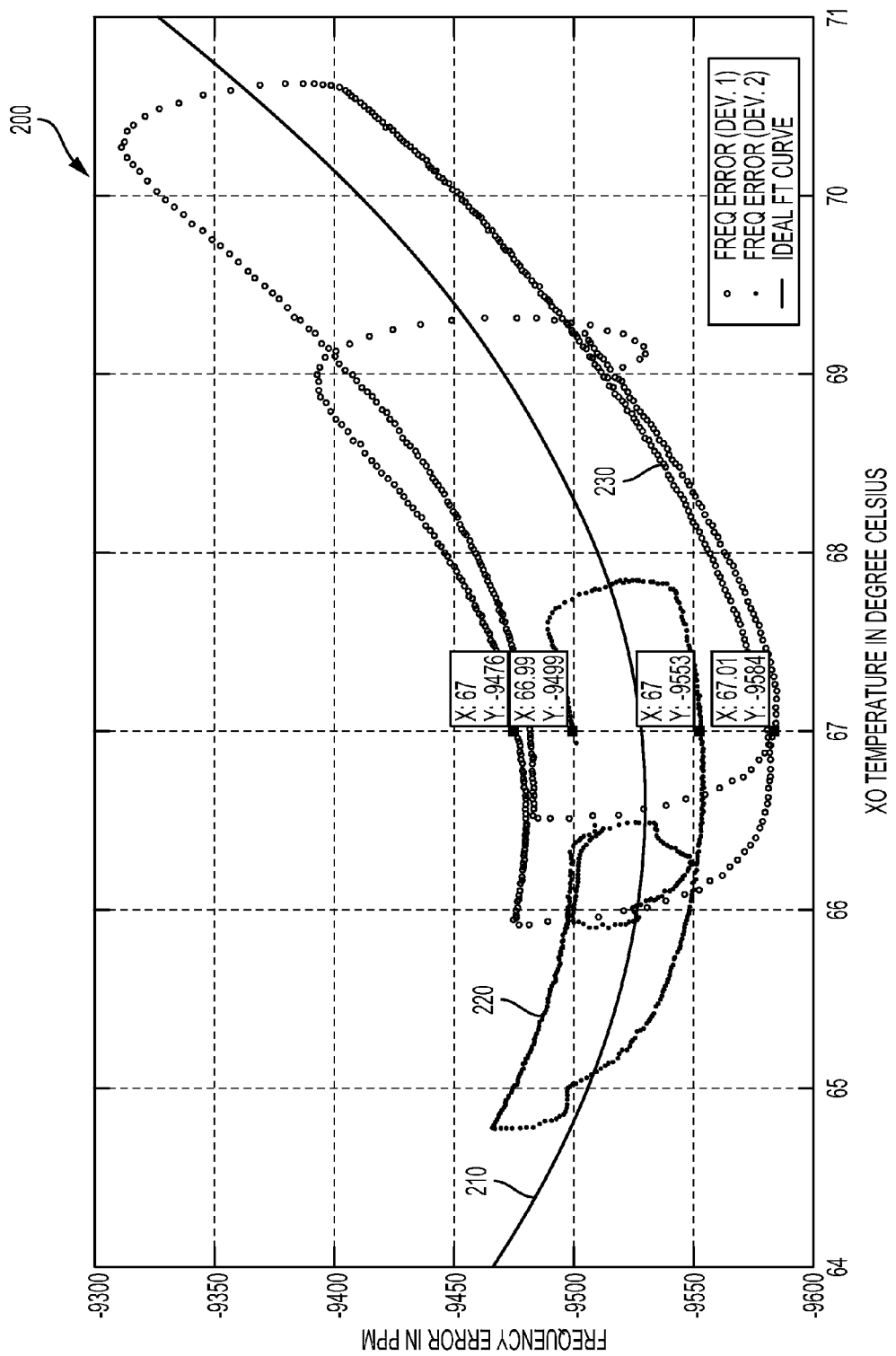
FIGS. 2 and 3 show plots of frequency error as a function of temperature in a signal output by a timing circuit having a crystal oscillator with hysteretic characteristics.

Referring now to FIG. 2, FIG. 2 shows a plot 200 of frequency error in a crystal oscillator's output as a function of temperature with hysteretic characteristics. The frequency error is relative to a nominal vibration frequency of a crystal oscillator. The plot 200 includes an ideal frequency error versus temperature curve 210 for a crystal oscillator, similar to that shown in FIG. 1. The plot 200 also includes two frequency error versus temperature curves 220, 230 that show a hysteretic response of the crystal oscillator to temperature changes. Referring first to curve 220, curve 220 shows a plot of frequency error based on temperature changes over time. As can be seen, the frequency error at 67 degrees Celsius for curve 220 has two different values: −9499 parts per billion (ppb) and −9553 ppb. As discussed above, these different values result, at least in part, from the hysteretic characteristics of the crystal oscillator. Thus in this example, as the crystal oscillator heats, the frequency error (illustrated by curve 220) relative to the nominal vibration frequency of the output signal is less than the ideal frequency error curve 210, but while the crystal oscillator cools, the frequency error relative to the nominal vibration frequency of the output signal is greater than the ideal frequency error curve 210 at the same temperature. As can be seen from this example, a frequency variance (and hence a frequency error) can have a first value at a given temperature as well as a second value at the given temperature. Hence, in general, the frequency variance (and the frequency compensation parameter, as discussed further below) can have a first value at a temperature where the sign of the temperature gradient has a first sign and a second value at the temperature where the sign of the temperature gradient has a second sign where the first value and the second value are different and the first sign and the second sign are different.

In addition, FIG. 2 shows a second curve 230. Curve 230 also shows a plot of frequency error relative to the nominal vibration frequency based on temperature changes over time; however, the magnitudes of the hysteresis in the frequency error of the second curve 230 are generally greater than the magnitudes of the variances of the first curve 220. As can be seen in FIG. 2, the frequency error relative to the nominal vibration frequency at 67 degrees Celsius for the second curve 230 are −9476 ppb and −9584 ppb, while for the first curve 220, they are −9499 ppb and −9553 ppb. The difference in frequency error between the two curves 220, 230 is based on the differences in the time gradient of temperature underlying the respective frequency errors. The temperature gradients resulting from the heating and cooling of the crystal oscillator that contributed to the first curve 220 had a lower magnitude than the temperature gradients that contributed to the second curve 230.

Figure 3:
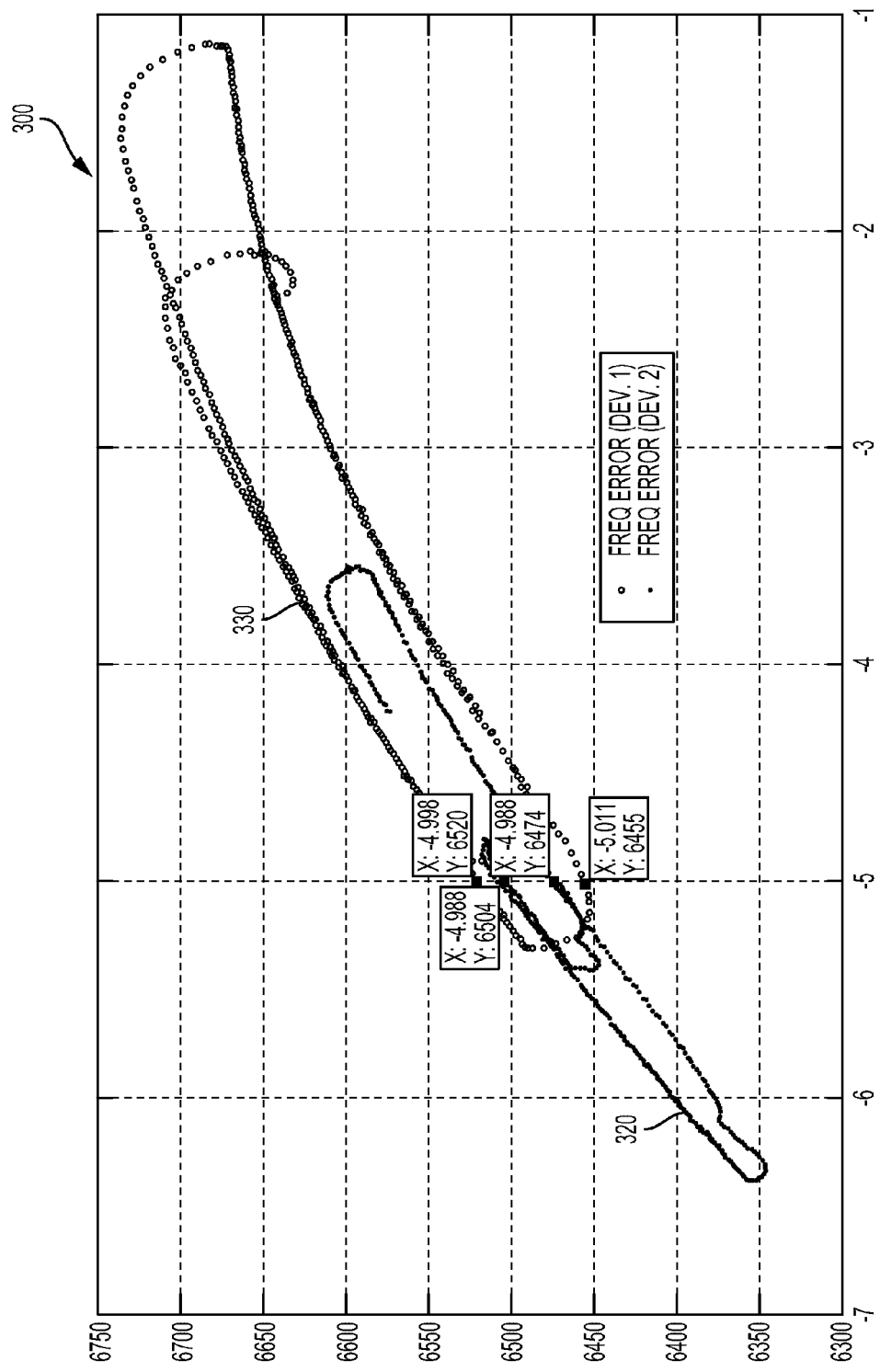

Referring now to FIG. 3, FIG. 3 shows a plot 300 of frequency error in a crystal oscillator as a function of temperature with hysteretic characteristics. The plot 300 of FIG. 3 does not include an ideal frequency error versus temperature curve like the curve 210 shown in FIG. 2. Rather, the plot 300 includes two frequency error versus temperature curves 320, 330 that show hysteretic responses of the crystal oscillator to different temperature changes. As with the curves 220, 230 shown in FIG. 2, the curves 320, 330 in FIG. 3 show variance from the ideal frequency error based on temperature changes over time. In this case, the variances on the first curve 320 at −5 degrees Celsius are 6504 ppb and 6474 ppb and the variances on the second curve 330 at the same temperature, −5 degrees Celsius, are 6520 and 6455, respectively. Again, in this example, the variance from the ideal frequency error is based on the temperature gradient and the sign of the temperature gradient. In some examples, calculating the variance may be based on empirically measured oscillation frequency response data of the crystal to temperature gradients and the signs of those gradients and difference between the measured oscillation frequency values and the ideal frequency error. One example may employ a means for determining a variance from the ideal frequency error based at least on the temperature gradient to provide the variance. These measured values may further be stored in a lookup table and some examples may access the measured values in the lookup table based on a measured temperature and a temperature gradient. Therefore, a corrected vibration frequency can be calculated based on a nominal vibration frequency, an ideal frequency error, and a variance from the ideal frequency error. The variance from the ideal frequency error can exhibit hysteretic characteristics.

However, as can be seen, the magnitude of the hysteretic effects illustrated by curves 220, 230 in FIG. 2 was larger than those illustrated by the curves 320, 330 in FIG. 3, which occurred at a lower temperature range. The variance from the ideal frequency error in a crystal oscillator's output signal exhibits hysteretic characteristics that are dependent, at least in part, on both a temperature gradient, including the sign and magnitude of the gradient, as well as the temperature of the crystal.

Figure 4:
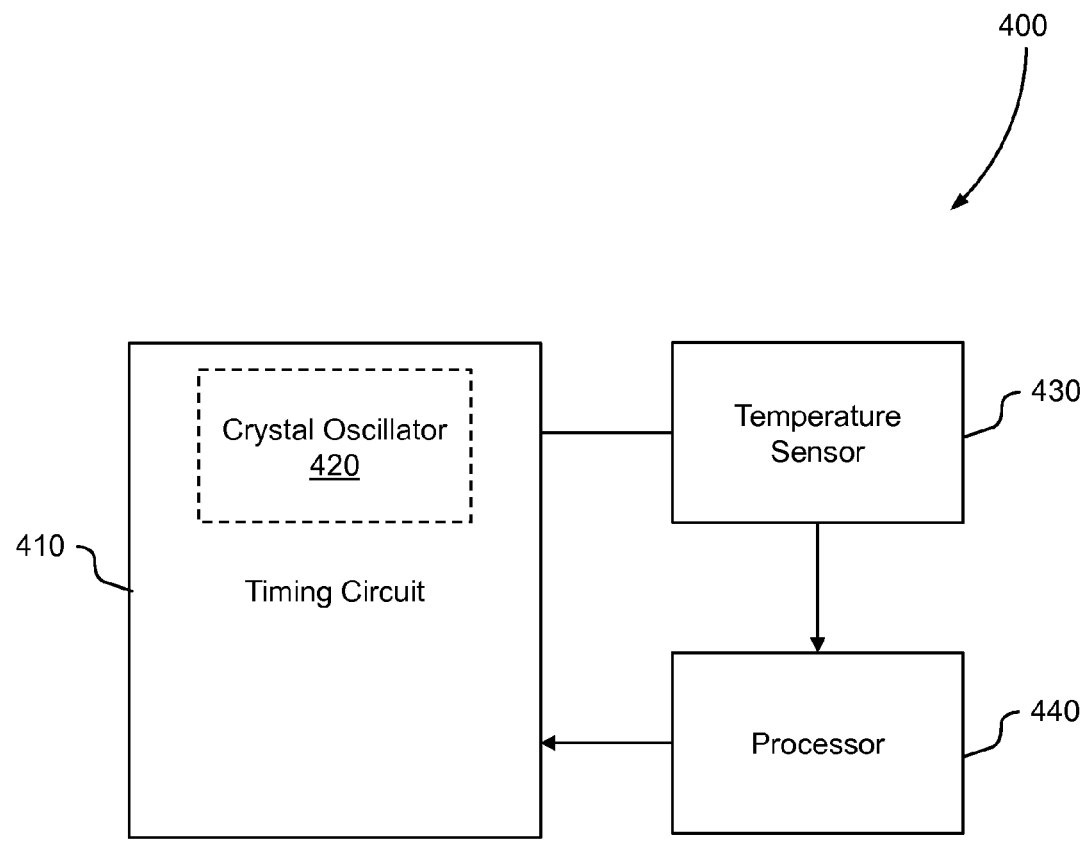
FIG. 4 shows an example system for compensating for hysteretic effects in crystal oscillators.

Referring now to FIG. 4, FIG. 4 shows an example system 400 for compensating for hysteretic effects in crystal oscillators. The system 400 includes a timing circuit 410, which includes a crystal oscillator 420, a temperature sensor 430, and a processor 440. This example system 400 may be incorporated into many different types of devices. For example, suitable devices include smartphones, cellular phones, tablets, laptop computers, navigational systems for vehicles.

In the system 400 shown in FIG. 4, the timing circuit 410 provides an oscillation signal having a frequency based on vibrations of the crystal oscillator 420. As described above, the vibrations of the crystal oscillator may vary depending on temperature and a temperature gradient, including the sign and the magnitude of the temperature gradient. The temperature sensor 430 is thermally coupled to and senses the temperature of the crystal oscillator 420 over time and provides successive temperature measurements to the processor 440. Various types of temperature sensors may be employed in different example systems according to this disclosure. For example, thermocouples and thermistors are example means for obtaining a plurality of successive temperature measurements. And while the system 400 shown in FIG. 4 only includes one temperature sensor, multiple sensors can be used in different examples.

The processor 440 uses the successive temperature measurements to calculate temperature gradients and to determine a frequency compensation parameter for the timing circuit 410. In this example system 400, the processor 440 executes program code to determine a frequency compensation parameter based on any combination of two or more factors chosen from a set of factors including a temperature measurement, the sign of the temperature gradient, and the magnitude of the temperature gradient. The processor 440 also causes the timing circuit 410 to output an oscillation signal based on the frequency compensation parameter. In this example, over time, the processor 440 iteratively determines multiple successive frequency compensation parameters and causes the timing circuit 410 to output oscillation signals based on the successive frequency compensation parameters, which allows the processor 440 to compensate for frequency error as the crystal oscillator changes temperature over time.

Figure 5A:
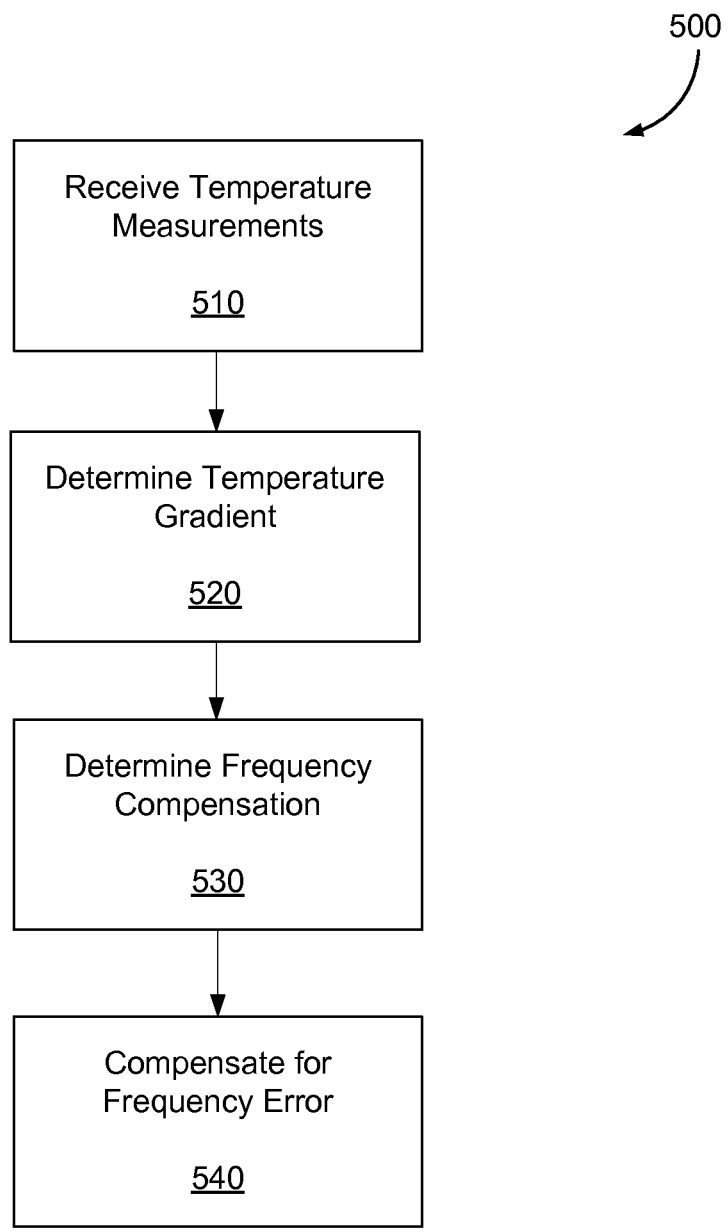
FIGS. 5A-6 show example methods for compensating for hysteretic effects in crystal oscillators.

Referring now to FIG. 5A, FIG. 5A shows an example method 500 for compensating for hysteretic effects in crystal oscillators. The method 500 of FIG. 5A is described with reference to the example system 400 shown in FIG. 4, but is not limited to such a system 400.

The method 500 begins in block 510 when the processor 440 obtains a plurality of successive temperature measurements from the temperature sensor 430, or from a plurality of temperature sensors. The temperature sensor 430 can periodically send successive temperature measurements to the processor 440, or the processor 440 can periodically poll the temperature sensor 430 for successive temperature measurements. In the context of this description, successive temperature measurements refers to multiple temperature measurements of the timing circuit 410 or the crystal oscillator 420, or a component near to either of the timing circuit 410 or crystal oscillator 420, occurring at different times and does not imply periodic or regular temperature measurements, though periodic or regular temperature measurements may be suitable for different examples according to this disclosure.

In block 520, the processor 440 determines a temperature gradient having a sign and a magnitude, the temperature gradient based on at least two temperature measurements of the plurality of successive temperature measurements and a time between the at least two temperature measurements. For example, the example system 400 shown in FIG. 4 calculates a temperature gradient using two consecutive temperature measurements: a first temperature measurement and a second temperature measurement, where the first temperature measurement occurs prior to the second temperature measurement. In one implementation, the processor 440 subtracts the first temperature measurement from the second temperature measurement and divides the result by the time between the two measurements to obtain the gradient. However, the processor 440 can be configured to determine a temperature gradient based on two or more successive temperature measurements over time or two or more non-successive temperature measurements (e.g., a first and a fifth temperature measurement of a succession of five temperature measurements). For example, over more than two successive temperature samples, the processor 440 can calculate temperature gradients for successive pairs of temperature samples and calculate an average gradient based on the calculated temperature gradients to determine the temperature gradient having the sign and the magnitude.

In some embodiments, the processor 440 can employ more than two successive temperature samples to determine a temperature gradient. For example, the processor may determine a temperature gradient using three successive temperature measurements, such as by determining an average temperature gradient over such measurements. In some examples, the processor may use two or more non-consecutive temperature measurements, such as every other temperature measurement or other regularly-spaced temperature measurements. In one such example, the processor may employ every third temperature measurement based on a sampling frequency of temperature measurements. For example, if a temperature measurement is taken every 10 milliseconds, the processor 440 may be configured to only determine temperature gradients over time periods of 50 or 100 milliseconds, thus only certain of the temperature measurements may be employed.

In some examples, the processor 440 may also determine a rate of change of a temperature gradient over time such as by calculating successive temperature gradients and a difference between the successive temperature gradients. The rate of change of the temperature gradient may indicate an acceleration or deceleration of the temperature gradient, e.g., that the crystal oscillator is heating or cooling more or less quickly over time. In some examples, the processor 440 may employ curve fitting over a plurality of temperature measurements to compute a gradient. In one example, the processor 440 employs curve fitting over a plurality of successive temperature measurements, while in one example, the processor 440 employs curve fitting over a plurality of non-successive temperature measurements.

These and other means for determining a temperature gradient having a sign and a magnitude may be used in different examples. In this example, the processor 440 also determines the magnitude of the gradient and the sign of the gradient, or whether the gradient has a positive or negative slope. It should be noted that temperature gradient for purposes of this application relates to gradient with respect to time.

In block 530, the processor 440 determines a frequency compensation parameter based on at least one or more of a temperature measurement, the sign of the temperature gradient, the magnitude of the temperature gradient, or any combination thereof. In this example, the processor 440 uses the temperature to access a lookup table having frequency compensation parameters corresponding to different measured temperatures. It will be understood that the temperature measurement may comprise one of the successive temperature measurements, or may be a temperature measurement taken independently of the successive temperature measurements, such as a temperature measurement taken at a specific time or sampling rate, or may be taken specifically for purposes of accessing a lookup table. In other examples, the sign of the temperature gradient or the magnitude of the temperature gradient, alone, may be used. For example, in one implementation, the processor 440 uses the sign of the temperature gradient to access a lookup table having frequency compensation parameters corresponding to temperature gradients having different signs. In another example, the processor 440 uses the magnitude of the temperature gradient to access a lookup table having frequency compensation parameters corresponding to temperature gradients of different magnitudes.

Thus, in some examples, only one of the temperature measurement, the sign of the temperature gradient, or the magnitude of the temperature gradient is used to determine a frequency compensation parameter. And while examples using lookup tables were discussed above, other examples are contemplated. For example, any one of the temperature measurement, the sign of the temperature gradient, or the magnitude of the temperature gradient may be used to calculate a variance from the first-order calculation of the vibration frequency, where the first-order calculation of the vibration frequency is based on the nominal vibration frequency of the crystal oscillator and the ideal frequency error. The variance may then be used to compute a frequency compensation parameter. In other implementations, the variance, along with the first-order calculation of the vibration frequency, is used to calculated a corrected vibration frequency, and the frequency compensation parameter is based on the nominal vibration frequency and the corrected vibration frequency.

And while some examples may employ only one of the values discussed above to determine a frequency compensation parameter, some examples may employ two. For example, in one implementation the processor 440 determines a frequency compensation parameter by employing at least the magnitude of the temperature gradient and the temperature to access a lookup table having frequency compensation parameters corresponding to different measured temperatures and temperature gradient magnitudes. In another example implementation, the processor 440 determines a frequency compensation parameter by employing the temperature measurement and the sign of the temperature gradient to access a lookup table having frequency compensation parameters corresponding to different temperatures and signs of the temperature gradient. And in a further example, the processor 440 determines a frequency compensation parameter by employing the magnitude of the temperature gradient and the sign of the temperature gradient to access a lookup table having frequency compensation parameters corresponding to different temperature gradient magnitudes and signs.

In some cases, the processor 440 may determine a frequency compensation parameter based on at least all three of the temperature gradient, the sign of the temperature gradient, and the frequency. In one example implementation, the processor 440 accesses a three-dimensional lookup table to determine a frequency compensation parameter. In some examples, the processor 440 may employ a plurality of lookup tables. For example a processor 440 may access a first lookup table based on the temperature measurement and the sign of the gradient, and use a resulting value from the first lookup table and the magnitude of the temperature gradient to access a second lookup table to determine a frequency compensation parameter. Thus, different examples may employ different means for determining a frequency compensation parameter based on any combination of two or more factors chosen from a set of factors including a temperature measurement, the sign of the temperature gradient, or the magnitude of the temperature gradient, including determining a frequency compensation parameter based on at least all three of the temperature measurement, the sign of the temperature gradient, and the magnitude of the temperature gradient. Further, some such means may comprise a means for determining the frequency compensation parameter based on a lookup table using at least the temperature measurement and the magnitude of the temperature gradient as a part of a means for determining the frequency compensation parameter. The means for determining the frequency compensation parameter may also include means for determining the frequency compensation parameter based on additional factors to those mentioned.

However, in some cases, the processor 440 may calculate a variance from an ideal frequency error based on the magnitude of the temperature gradient and a first-order calculation of the vibration frequency of the crystal oscillator. In this example method 500, the processor 440 calculates a variance from an ideal frequency error by multiplying a scaling factor and a thermal gradient that has been filtered to remove noise. In another example, the processor 440 may calculate a first-order calculation of the corrected frequency value of the crystal oscillator using the function 120 shown in FIG. 1 and the nominal vibration frequency, and the processor 440 may then use the calculated first-order value with the temperature gradient to determine the total frequency error or total variance relative to the nominal vibration frequency. In some cases, the processor 440 may simplify the calculation by assuming equal error or variance irrespective of the sign of the gradient. These and other means for determining a frequency compensation parameter may be employed in different examples. The processor 440 can then use the determined total frequency error or total variance to determine a frequency compensation parameter.

After obtaining the frequency compensation parameter, in this example the processor 440 determines how the frequency compensation parameter should be applied to the nominal frequency of the crystal oscillator 420 or the timing circuit 410 to adjust the frequency of the oscillation signal output by the timing circuit 410. In this way, the processor 440 can compensate for the frequency error of the timing circuit 410 based on the frequency compensation parameter. For example, the frequency compensation parameter may be a value that can be a scaling factor that may be applied to a frequency divider or frequency multiplier circuit to adjust a sampling rate. In some examples, the frequency compensation parameter can be applied to a resampler to adjust a sampling rate to enable the output data to be provided at a corrected frequency. Or in some cases, the frequency compensation parameter may be applied to a phase rotator digitally.

In block 540, the processor 440 compensates for a frequency error of the timing circuit 410 based on the frequency compensation parameter. For example, the processor 440 may cause the timing circuit 410 to generate an oscillation signal using the timing circuit 410 based on the frequency compensation parameter. For example, the timing circuit 410 may include a frequency multiplier or frequency divider. The processor 440 can cause the frequency multiplier or frequency divider to alter the signal output by the crystal oscillator 420 to generate an oscillation signal based on the frequency compensation parameter. However, in some embodiments, the processor 440 does not affect the timing circuit 410, but instead provides the frequency compensation parameter to a component, such as GPS receiver, that receives the oscillation signal using the timing circuit 410 to allow the component to apply the frequency compensation parameter to the received oscillation signal. These and other means for compensating for a frequency error of the timing circuit 410 may be employed according to various examples of the disclosure herein.

Figure 5B:
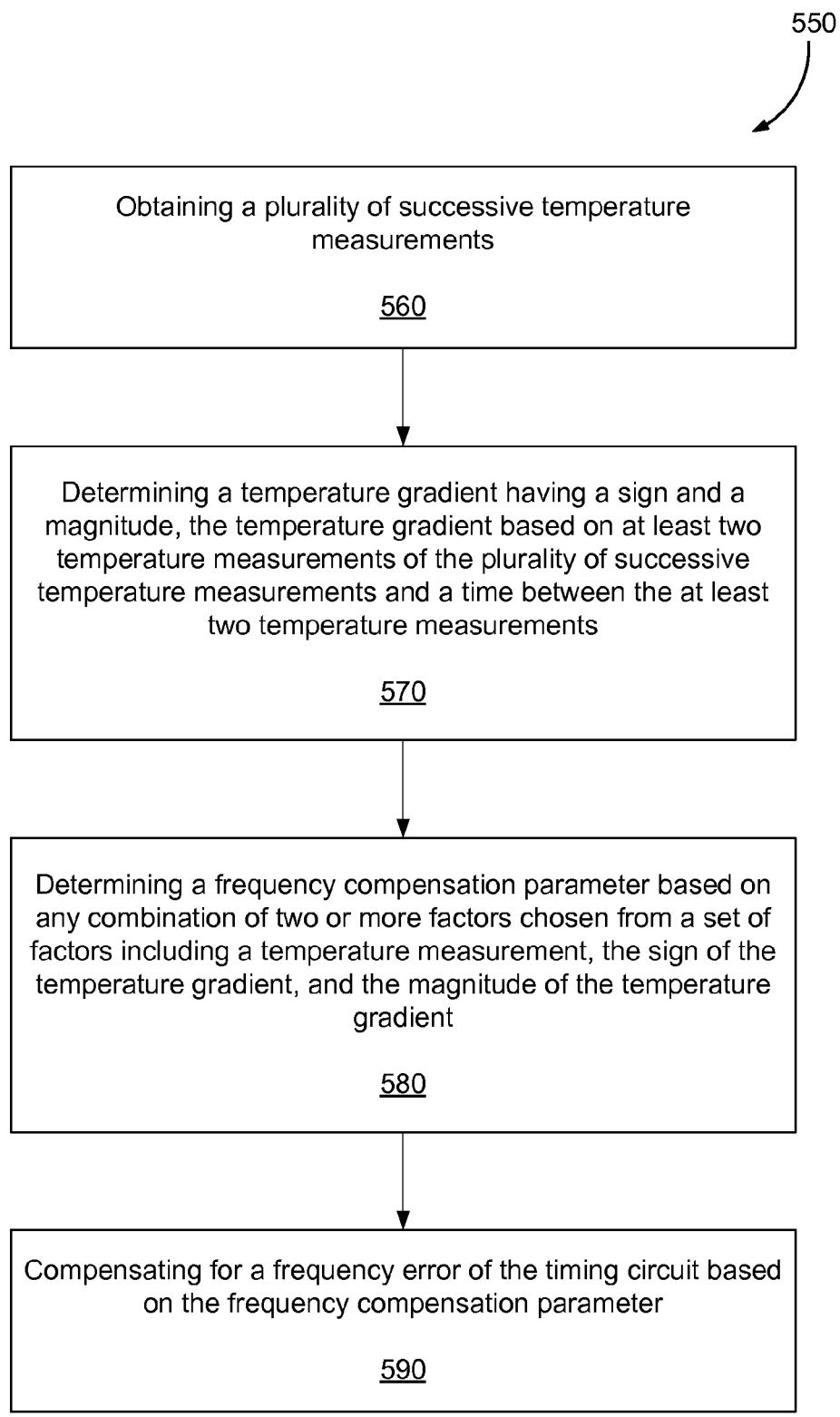

Referring now to FIG. 5B, FIG. 5B shows an example method 550 for compensating for hysteretic effects in crystal oscillators. The method 550 of FIG. 5B is described with reference to the example system 400 shown in FIG. 4, but is not limited to such a system 400.

The method 550 begins in block 560 when the processor 440 obtains a plurality of successive temperature measurements from the temperature sensor 430. This process is described above with respect to block 510 shown in FIG. 5A. After the processor 440 obtains a plurality of successive temperature measurements, the method 550 proceeds to block 570.

At block 570, the processor 440 determines a temperature gradient having a sign and a magnitude, the temperature gradient being based on at least two temperature measurements of the plurality of successive temperature measurements and a time between the at least two temperature measurements. This process is described above with respect to block 520 shown in FIG. 5A. After the processor 440 determines a temperature gradient, the method 550 proceeds to block 580.

At block 580, the processor 440 determines a frequency compensation parameter based on any combination of two or more factors chosen from a set of factors including a temperature measurement, the sign of the temperature gradient, and the magnitude of the temperature gradient. This process is described above with respect to block 530 shown in FIG. 5A. After the processor 440 determines a temperature gradient, the method 550 proceeds to block 590.

At block 590, the processor 440 compensates for a frequency error of the timing circuit based on the frequency compensation parameter. This process is described above with respect to block 540 shown in FIG. 5A. After the processor 440 determines a temperature gradient, the method 550 may end, or the method 550 may return to block 560 for a further iteration.

Figure 6:
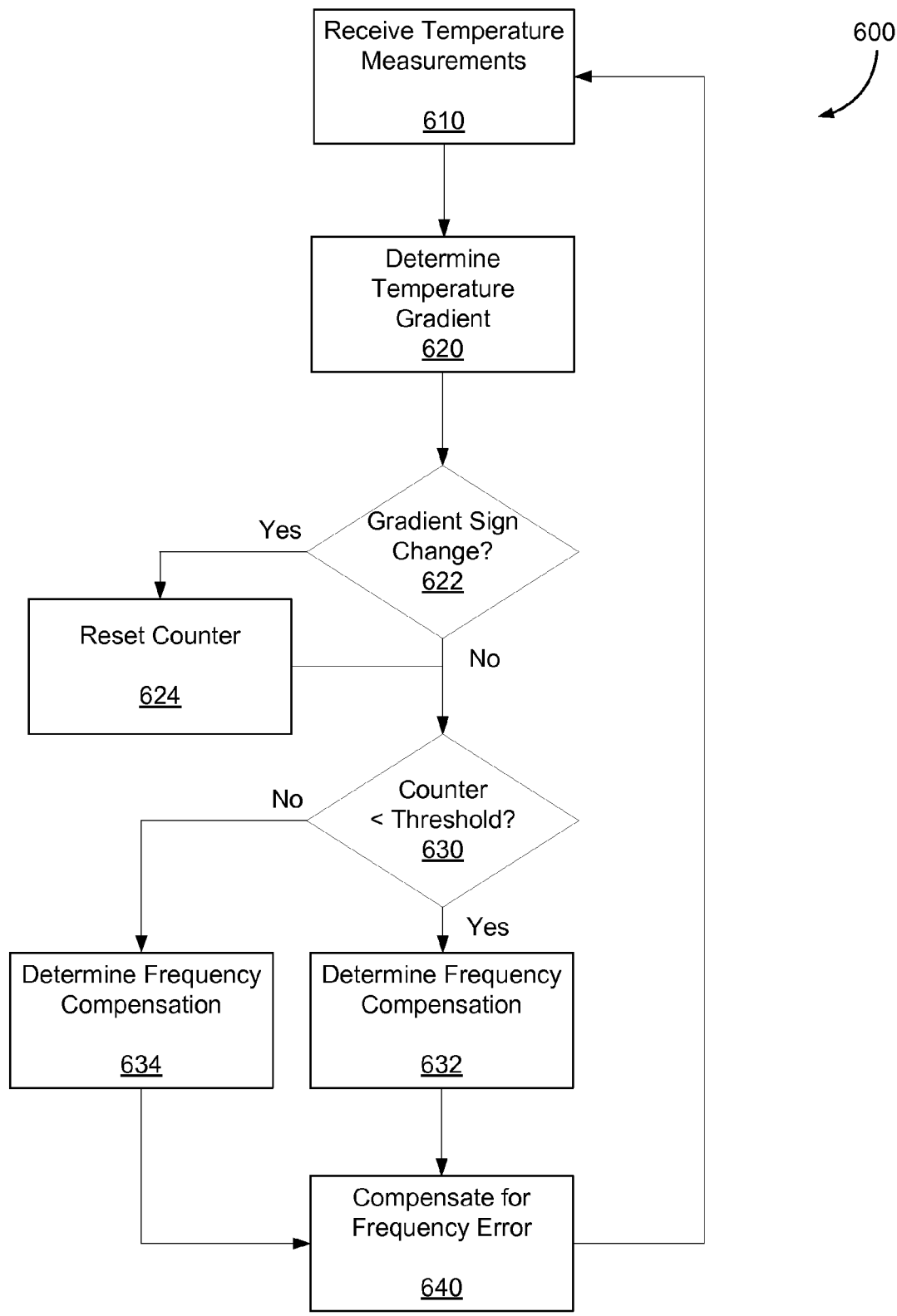

Referring now to FIG. 6, FIG. 6 shows an example method 600 for compensating for hysteretic effects in crystal oscillators. The method 600 of FIG. 6 is described with reference to the example system 400 shown in FIG. 4, but is not limited to such a system 400.

The method 600 begins in block 610 when the processor 440 obtains a plurality of successive temperature measurements from the temperature sensor 430. This process is described above with respect to block 510 shown in FIG. 5A. In addition, if this is the first iteration of the method, a counter value is set to 0. The counter will be described in greater detail below. After the processor 440 obtains a plurality of successive temperature measurements, the method 600 proceeds to block 620.

At block 620, the processor 440 determines a temperature gradient having a sign and a magnitude, the temperature gradient based on the plurality of successive temperature measurements, the temperature measurements being received from a temperature sensor thermally coupled to the oscillation crystal. This process is described above with respect to block 520 shown in FIG. 5A. After the processor 440 determines a temperature gradient, the method 600 proceeds to block 622.

At block 622, the processor 440 determines whether the temperature gradient has a different sign during the then-current iteration of the method 600 as compared to the sign of the temperature gradient during the prior iteration of the method 600. If the sign of the gradient has not changed, the method proceeds to 630. However, if the sign of the gradient has changed, the method proceeds to block 624.

At block 624, the processor 440 resets the counter. As will be discussed in more detail below, the counter may be used to affect the maximum amount the current frequency compensation may be changed. Thus, for time periods shortly after a change in sign of the temperature gradient, the processor 440 may be allowed to change a frequency compensation by a greater amount than would be allowed after a period of time has elapsed. The method then proceeds to block 630.

At block 630, the processor 440 increments the counter and determines whether it exceeds a reference threshold value. In this example, the counter (which is discussed in greater detail below) and threshold value are employed to determine whether a greater or lesser correction should be applied to the oscillation signal. In some examples, if a magnitude of frequency error due to hysteretic effects in a timing circuit 410 exceeds a maximum incremental frequency compensation value, the processor 440 will apply an incremental frequency compensation to the oscillation signal that is configured to only partially correct for the frequency error. For example, if a frequency error does not exceed the maximum incremental frequency compensation value, the processor 440 may fully compensate for the frequency error in one iteration of the example method 600. However, if the frequency error exceeds the maximum incremental frequency compensation value, the processor 440 may apply a maximum incremental frequency compensation, which only partially compensates for the determined frequency error. Thus, a full correction based on the determined frequency error may be applied over multiple iterations.

Further, in some examples, different maximum incremental frequency compensation values may be employed based on an elapsed period of time. In one example, if the processor 440 determines that the timing circuit 410 has recently begun to experience significant heating or cooling, it may allow for larger incremental changes in frequency compensation, but after the heating or cooling has continued for some period of time, a smaller maximum incremental frequency compensation value may be employed.

In some examples, the processor 440 may employ one or more maximum incremental frequency compensation values based on the magnitude of the temperature gradient. For example, where the magnitude of the temperature gradient exceeds a first threshold value, the processor 440 may use a greater maximum incremental frequency compensation value, and a lower maximum incremental frequency compensation value if the temperature gradient is below the threshold value. One such example may thus more quickly correct for rapid heating or cooling of the timing circuit 410, e.g., due to cellular phone call, and reduce the rate of correction for gradual heating or cooling, such as due to changing environment conditions.

In the example illustrated in FIG. 6, the processor 440 selects between two maximum incremental frequency compensation values based on whether the counter exceeds a threshold counter value. If the counter value is below the threshold counter value, the processor 440 uses the first maximum incremental frequency compensation value, which is greater than the second maximum incremental frequency compensation value. Thus, while the counter is below the threshold counter value, the processor 440 may apply greater incremental frequency compensation. After the counter exceeds the threshold counter value, the processor 440 uses the second maximum incremental frequency compensation value. In this example, the method 600 iterates approximately every 100 milliseconds ("ms"), however, in other examples, the method 600 may iterate at greater or lesser rates. Further, in this example, the threshold counter value is set to 20, indicating that the processor 440 will employ the first maximum incremental frequency compensation value for up to approximately two seconds from the last time the counter was reset (as discussed above with respect to blocks 622 and 624), after which, the processor 440 will employ the second maximum incremental frequency compensation value.

It should be noted that while the processor 440 may determine a frequency compensation based on an amount that is equal to a first or second maximum incremental frequency compensation value and based on the threshold counter value, in some examples, the processor 440 may determine a frequency compensation that is less than one or more maximum incremental frequency compensation values, or in some examples, the processor 440 may not employ one or more incremental frequency compensation values, and may instead determine the frequency compensation based on a determined frequency error of the timing circuit 410. In this example, the processor 440 may determine a frequency compensation parameter based on an amount that is less than the selected maximum incremental frequency compensation value. For example, if the threshold counter value has not yet been reached and the measured frequency error would require a frequency compensation that is less than the first maximum incremental frequency compensation value, the processor 440 changes the frequency compensation by the determined frequency compensation. The above algorithms described additional means for determining a frequency compensation based on any combination of two or more factors chosen from a set of factors including a temperature measurement, the sign of the temperature gradient, and the magnitude of the temperature gradient. And in some examples, the processor 440 may determine a frequency compensation based on any combination of two or more factors selected from a group consisting of the temperature measurement, the sign of the temperature gradient, and the magnitude of the temperature gradient.

In this example, if the counter exceeds the threshold counter value, the method 600 proceeds to block 632, otherwise the method 600 proceeds to block 634.

At block 632, the processor 440 determines a frequency compensation parameter based on any combination of two or more factors of a temperature measurement, the sign of the temperature gradient, or the magnitude of the temperature gradient, such as described above with respect to block 530 of FIG. 5A. It is understood that the frequency compensation parameter may also be further based on additional factors in this or other implementations. In addition, the processor 440 maintains the current amount of frequency compensation applied to the oscillation signal. For example, in previous iterations of the method 600, the processor 440 may have applied a frequency compensation to the oscillation signal; however, additional frequency compensation may be needed, or the current frequency compensation may need to be reduced. Thus, the processor 440 determines a desired frequency compensation and then determines the difference between the desired frequency compensation and the current frequency compensation. If the difference is less than the second maximum incremental frequency compensation value, the processor 440 determines that the current frequency compensation should be changed by applying the full difference to arrive at a current frequency compensation, resulting in a difference of 0 between the desired frequency compensation and the current frequency compensation. However, if the difference is greater than the second maximum incremental frequency compensation value, the processor 440 applies the second maximum incremental frequency compensation value to the current frequency compensation, which will result in a non-zero difference between the desired frequency compensation and the current frequency compensation. This difference may be addressed in a further iteration of the method 600. After the current frequency compensation is determined, the method proceeds to block 640.

At block 634, similar to block 632, the processor 440 determines a frequency compensation parameter based on any combination of two or more parameters of a temperature measurement, the sign of the temperature gradient, or the magnitude of the temperature gradient, such as described above with respect to block 530 of FIG. 5A. As discussed with respect to 632, the processor 440 maintains the current frequency compensation applied to the oscillation signal, determines a desired frequency compensation, and then determines the difference between the desired frequency compensation and the current frequency compensation. In block 634, however, the processor 440 employs the first incremental frequency compensation value. Thus, if the difference is less than the first maximum incremental frequency compensation value, the processor 440 determines that the current frequency compensation should be changed by applying the difference, resulting in a difference of 0 between the desired frequency compensation and the current frequency compensation. However, if the difference is greater than the first maximum incremental frequency compensation value, the processor 440 applies the first maximum incremental frequency compensation value to the current frequency compensation, which will result in a non-zero difference between the desired frequency compensation and the current frequency compensation. As discussed above, this difference may be addressed in a further iteration of the method 600. The functionality of blocks 622-634 provides various means for determining a frequency compensation parameter based on any combination of two or more factors chosen from a temperature measurement, the sign of the temperature gradient, and the magnitude of the temperature gradient, though others would be readily apparent to one of skill in the art. After the current frequency compensation is determined, the method proceeds to block 640.

At block 640, the processor 440 compensates for a determined frequency error of the timing circuit 410 based on the frequency compensation parameter. For example, and as discussed above with respect to block 540 of the method 500 shown in FIG. 5A, the timing circuit 410 may include a frequency multiplier or frequency divider. The processor 440 can cause the frequency multiplier or frequency divider to alter the signal output by the crystal oscillator 420 to generate an oscillation signal based on the current frequency compensation. However, in some embodiments, the processor 440 does not affect the timing circuit 410, but instead provides the current frequency compensation to a component, such as GPS receiver, that receives the oscillation signal using the timing circuit 410 to allow the component to apply the current frequency compensation to the received oscillation signal. These and other means for compensating for a determined frequency error of the timing circuit 410 may be employed according to various examples of the disclosure herein.

After the processor 440 causes the timing circuit 410 to generate an oscillation signal using the timing circuit 410 based on the frequency compensation parameter, the method 600 completes. In some examples, the method 600 returns to block 610 for another iteration. While the methods and systems herein are described in terms of software executing on various machines, the methods and systems may also be implemented as specifically-configured hardware, such as field-programmable gate array (FPGA) specifically to execute the various methods. For example, embodiments can be implemented in digital electronic circuitry, or in computer hardware, firmware, software, or in a combination thereof. In one embodiment, a device may comprise a processor or processors. The processor comprises a computer-readable medium, such as a random access memory (RAM) coupled to the processor. The processor executes computer-executable program instructions stored in memory, such as executing one or more computer programs for editing an image. Such processors may comprise a microprocessor, a digital signal processor (DSP), an application-specific integrated circuit (ASIC), field programmable gate arrays (FPGAs), and state machines. Such processors may further comprise programmable electronic devices such as PLCs, programmable interrupt controllers (PICs), programmable logic devices (PLDs), programmable read-only memories (PROMs), electronically programmable read-only memories (EPROMs or EEPROMs), or other similar devices.

Such processors may comprise, or may be in communication with, media, for example non-transitory computer-readable media, that may store instructions that, when executed by the processor, can cause the processor to perform the steps described herein as carried out, or assisted, by a processor. Embodiments of computer-readable media may comprise, but are not limited to, an electronic, optical, magnetic, or other storage device capable of providing a processor, such as the processor in a web server, with computer-readable instructions. Other examples of media comprise, but are not limited to, a floppy disk, CD-ROM, magnetic disk, memory chip, ROM, RAM, ASIC, configured processor, all optical media, all magnetic tape or other magnetic media, or any other medium from which a computer processor can read. The processor, and the processing, described may be in one or more structures, and may be dispersed through one or more structures. The processor may comprise code for carrying out one or more of the methods (or parts of methods) described herein.

The foregoing description of some embodiments has been presented only for the purpose of illustration and description and is not intended to be exhaustive or to limit the disclosure to the precise forms disclosed. Numerous modifications and adaptations thereof will be apparent to those skilled in the art without departing from the spirit and scope of the disclosure.

Reference herein to an embodiment, example, or implementation means that a particular feature, structure, operation, or other characteristic described in connection with the embodiment may be included in at least one implementation of the disclosure. The disclosure is not restricted to the particular embodiments, examples, or implementations described as such. The appearance of the phrases "in one embodiment," "in an embodiment," "in one example," or "in an example, "in one implementation," or "in an implementation," or variations of the same in various places in the specification does not necessarily refer to the same embodiment, example, or implementation. Any particular feature, structure, operation, or other characteristic described in this specification in relation to one embodiment, example, or implementation may be combined with other features, structures, operations, or other characteristics described in respect of any other embodiment, example, or implementation.

What is claimed is:

1. A method for compensating for hysteretic characteristics of a crystal oscillator in a timing circuit, comprising:
    obtaining a plurality of successive temperature measurements;

determining a temperature gradient having a sign and a magnitude, the temperature gradient based on at least two temperature measurements of the plurality of successive temperature measurements and a time between the at least two temperature measurements;

determining a frequency compensation parameter based on any combination of two or more factors chosen from a set of factors including a temperature measurement, the sign of the temperature gradient, and the magnitude of the temperature gradient; and compensating for a frequency error of the timing circuit based on the frequency compensation parameter.

2. The method of claim 1, wherein determining the frequency compensation parameter comprises:

determining an ideal frequency error of the crystal oscillator based at least on the temperature measurement;

determining a variance from the ideal frequency error based at least on the temperature gradient; and determining the frequency compensation parameter based on the variance and the ideal frequency error.

3. The method of claim 2, wherein determining the variance is further based on the temperature measurement.

4. The method of claim 1, wherein determining the frequency compensation parameter comprises determining the frequency compensation parameter based on a lookup table using at least the temperature measurement and the magnitude of the temperature gradient.

5. The method of claim 1, wherein compensating for the frequency error of the timing circuit based on the frequency compensation parameter comprises applying the frequency compensation parameter to a frequency divider or frequency multiplier circuit.

6. The method of claim 1, wherein determining the frequency compensation parameter is based on at least all three of the temperature measurement, the sign of the temperature gradient, and the magnitude of the temperature gradient.

7. The method of claim 1, wherein the frequency compensation parameter has a first value at a temperature, where the sign of the temperature gradient has a first sign, and a second value at the temperature, where the sign of the temperature gradient has a second sign, and wherein the first value and the second value are different and the first sign and the second sign are different.

8. The method of claim 1, wherein compensating for the frequency error of the timing circuit comprises causing the timing circuit to generate an oscillation signal based on the frequency compensation parameter.

9. The method of claim 1, wherein compensating for the frequency error of the timing circuit comprises providing the frequency compensation parameter to a component.

10. An apparatus for compensating for hysteretic characteristics of a crystal oscillator in a timing circuit, comprising:

a sensor configured to sense a temperature; and
a processor configured to:
obtain a plurality of successive temperature measurements from the sensor;
determine a temperature gradient having a sign and a magnitude, the temperature gradient based on at least two temperature measurements of the plurality of successive temperature measurements and a time between the at least two temperature measurements;
determine a frequency compensation parameter based on any combination of two or more factors chosen from a set of factors including a temperature measurement, the sign of the temperature gradient, and the magnitude of the temperature gradient; and
compensate for a frequency error of the timing circuit based on the frequency compensation parameter.

11. The apparatus of claim 10, wherein the processor being configured to determine the frequency compensation parameter by being configured to:

determine an ideal frequency error of the crystal oscillator based at least on the temperature measurement;

determine a variance from the ideal frequency error based at least on the temperature gradient; and determine the frequency compensation parameter based at least on the variance and the ideal frequency error.

12. The apparatus of claim 11, wherein the processor is further configured to determine the variance based on the temperature measurement.

13. The apparatus of claim 10, wherein the processor being configured to determine the frequency compensation parameter comprises the processor being configured to determine the frequency compensation parameter based on a lookup table using at least the temperature measurement and the magnitude of the temperature gradient.

14. The apparatus of claim 10, wherein the processor being configured to compensate for the frequency error of the timing circuit based on the frequency compensation parameter comprises applying the frequency compensation parameter to a frequency divider or frequency multiplier circuit.

15. The apparatus of claim 10, wherein the processor being configured to determine the frequency compensation parameter comprises the processor being configured to determine the frequency compensation parameter based on at least all three of the temperature measurement, the sign of the temperature gradient, and the magnitude of the temperature gradient.

16. A system for compensating for hysteretic characteristics of a crystal oscillator, comprising:

means for obtaining a plurality of successive temperature measurements;

means for determining a temperature gradient having a sign and a magnitude, the temperature gradient based on at least two temperature measurements the plurality of successive temperature measurements and a time between the at least two temperature measurements;

means for determining a frequency compensation parameter based on any combination of two or more factors chosen from a set of factors including a temperature measurement, the sign of the temperature gradient, and the magnitude of the temperature gradient; and means for compensating for a frequency error of a timing circuit based on the frequency compensation parameter.

17. The system of claim 16, wherein the means for determining a frequency compensation parameter comprises:

means for determining an ideal frequency error of the crystal oscillator based at least on the temperature measurement;

means for determining a variance from the ideal frequency error based at least on the temperature gradient; and means for determining the frequency compensation parameter based at least on the variance and the ideal frequency error.

18. The system of claim 17, wherein the means for determining the variance further determines the variance based on the temperature measurement.

19. The system of claim 16, wherein the means for determining the frequency compensation parameter includes means for determining the frequency compensation parameter based on a lookup table using at least the temperature measurement and the magnitude of the temperature gradient.

20. The system of claim 16, wherein the means for compensating for the frequency error of the timing circuit includes means for applying the frequency compensation parameter to a frequency divider or frequency multiplier circuit.

21. The system of claim 16, wherein the means for determining the frequency compensation parameter includes means for determining the frequency compensation parameter based on at least all three of the temperature measurement, the sign of the temperature gradient, and the magnitude of the temperature gradient.

22. A non-transitory computer-readable medium comprising program code for a processor to execute a method for compensating for hysteretic characteristics of a crystal oscillator in a timing circuit, the program code comprising:
  program code for obtaining a plurality of successive temperature measurements;
  program code for determining a temperature gradient having a sign and a magnitude, the temperature gradient based on at least two temperature measurements of the plurality of successive temperature measurements and a time between the at least two temperature measurements;
  program code for determining a frequency compensation parameter based on any combination of two or more factors chosen from a set of factors including a temperature measurement, the sign of the temperature gradient, and the magnitude of the temperature gradient; and
  program code for compensating for a frequency error of the timing circuit based on the frequency compensation parameter.

23. The non-transitory computer-readable medium of claim 22, wherein program code for determining the frequency compensation parameter comprises:
  program code for determining an ideal frequency error of the crystal oscillator based at least on the temperature measurement;
  program code for determining a variance from the ideal frequency error based at least on the temperature gradient; and
  program code for determining the frequency compensation parameter based at least on the variance and the ideal frequency error.

24. The non-transitory computer-readable medium of claim 23, wherein the program code for determining the variance further comprises program code for determining the variance based on the temperature measurement.

25. The non-transitory computer-readable medium of claim 22, wherein the program code for determining the frequency compensation parameter comprises program code for determining the frequency compensation parameter based on a lookup table using at least the temperature measurement and the magnitude of the temperature gradient.

26. The non-transitory computer-readable medium of claim 22, wherein the program code for compensating for the frequency error of the timing circuit based on the frequency compensation parameter includes program code for applying the frequency compensation parameter to a frequency divider or frequency multiplier circuit.

27. The non-transitory computer-readable medium of claim 22, wherein the program code for determining the frequency compensation parameter comprises program code for determining the frequency compensation parameter based on at least all three of the temperature measurement, the sign of the temperature gradient, and the magnitude of the temperature gradient.

* * * * *